United States Patent [19]

Kan

[11] Patent Number: 4,970,289

[45] Date of Patent: Nov. 13, 1990

[54] IMIDE-BASED PREPOLYMER AND VARNISH PREPOLYMER WITH RADICAL SCAVENGER

[75] Inventor: Kojiro Kan, Ichihara, Japan

[73] Assignee: Mitsui Petrochemical Industries, Ltd., Tokyo, Japan

[21] Appl. No.: 348,509

[22] Filed: May 8, 1989

[30] Foreign Application Priority Data

May 16, 1988 [JP] Japan ................................. 63-118836

[51] Int. Cl.⁵ ............................................. C08G 73/12
[52] U.S. Cl. .................................... 528/317; 524/606;
528/170; 528/313; 528/315; 528/316; 528/319; 528/321; 528/322
[58] Field of Search ............... 528/317, 322, 170, 313, 528/315, 316, 319, 321; 524/606

[56] References Cited

U.S. PATENT DOCUMENTS 3,878,172  4/1975  Bargain et al. ...................... 528/317

FOREIGN PATENT DOCUMENTS 0107897  5/1984  European Pat. Off. .

Primary Examiner—Harold D. Anderson
Attorney, Agent, or Firm—Birch, Stewart, Kolasch & Birch

[57] ABSTRACT

There is provided the process for producing an imide-based prepolymer having high solvent solubility by reacting an unsaturated bisimide of formula (I):

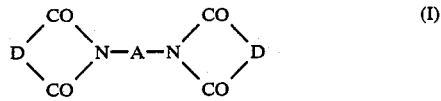

wherein D is a divalent group having a carbon-to-carbon double bond, and A is a divalent group having at least two carbon atoms, with a diamine in the presence of a radical scavenger.

19 Claims, No Drawings

IMIDE-BASED PREPOLYMER AND VARNISH PREPOLYMERS WITH RADICAL SCAVENGER

BACKGROUND OF THE INVENTION

The present invention relates to imide-based prepolymers having high heat stability. In particularly, the present invention relates to a process for producing imide-based prepolymers having high solvent solubility and to a varnish using such prepolymers.

A conventional process for producing imide-based prepolymers, in particular, those having good heat stability is described in Japanese Patent Publication No. 46-23250; a bisimide is mixed with a diamine under heating and the reaction occurs in a molten state, or a bisimide is reacted with a diamine under heating in a strongly polar and high-boiling point solvent such as N-methylpyrrolidone or dimethylformamide.

The imide-based resin produced by the method described in Japanese Patent Publication No. 46-23250 dissolves only in strongly polar and high-boiling point solvents such as N-methylpyrrolidone and dimethylformamide and the varnish prepared from such imide-based prepolymers does not have high storage stability.

This varnish may be impregnated in a glass cloth to prepare a prepreg and a plurality of such prepregs are superposed with copper foils to make a laminated board. However, because of its high boiling point, the solvent for the varnish will remain in the laminate, thus reducing the peel strength of a copper foil in the laminated board. This has been on of the major causes of deterioration in the quality of laminated boards.

SUMMARY OF THE INVENTION

An object, therefore, of the present invention is to solve the aforementioned problem of the prior art and to provide a process for producing an imide-based prepolymer that has high solubility in various types of solvents, in particular, low-boiling point solvents and which can be worked into varnish having high storage stability.

Another object of the present invention is to provide a novel and highly stable varnish that uses the imide-based prepolymer produced by said process.

In accordance with a first aspect of the present invention, there is provided a process for producing an imide-based prepolymer in which an unsaturated bisimide represented by formula (I):

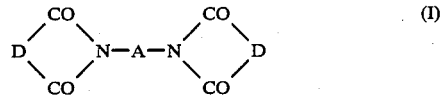

wherein D is a divalent group containing a carbon-to-a carbon double bond, and A is a divalent group containing at least two carbon atoms, is reacted with a diamine in the presence of a radical scavenger.

In accordance with a second aspect of the present invention, the imide-based prepolymer produced by this process is dissolved in a solvent to prepare varnish.

Other objects and advantages of the present invention will become apparent from a reading of the following description.

DETAILED DESCRIPTION OF THE INVENTION

In the process of the present invention for producing an imide-based prepolymer, an unsaturated bisimide represented by formula (I) is reacted with a diamine in the presence of a radical scavenger.

In the unsaturated bisimide of formula (I), symbol A may signify a straight-chained or branched alkylene group having 2-30 carbon atoms, an alkylene group consisting of a 5- or 6-membered ring, a divalent hetero ring containing at least one of O, N and S atoms, phenylene, or an aromatic hydrocarbon group consisting of a condensed ring. These groups may have substituents that will not cause any unwanted side reaction under the reaction conditions employed.

Symbol D in formula (I) represents a divalent group having a carbon-to-carbon double bond and may be illustrated by the following preferred examples:

wherein R is a hydrogen atom or an alkyl group,

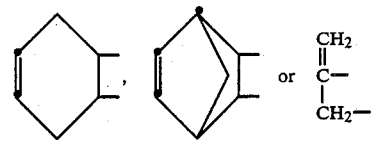

Preferred and specific examples of the N,N'-bisimide of formula (I) that may be employed in the present invention are listed below: N,N'-ethylenebismaleimide, N,N'-hexamethylenebismaleimide, N,N'-m-phenylenebismaleimide, N,N'-p-phenylenebismaleimide, N,N'-4,4'-diphenylmethanebismaleimide, N,N'-4,4'-diphenyletherbismaleimide, N,N'-3,4'-diphenyletherbismaleimide, N,N'-4,4'-diphenylsulfonebismaleimide, N,N'-m-xylenebismaleimide, N,N'-cyclohexanebismaleimide, N,N'-4,4'-diphenylmethanebiscitraconimide, etc.

Among these compounds, N,N'-m-phenylenebismaleimide and N,N'-4,4'-diphenylmethanebismaleimide are particularly preferred.

The bismaleimide of formula (I) may be reacted with various types of diamines including aliphatic, alicyclic and aromatic diamines, with diamines having 2-30 carbon atoms being preferred. Specifically, the following compounds may be listed as preferred examples: 4,4'-diaminodicyclohexylmethane, 1,4'-diaminocyclohexane, m-phenylenediamine, p-phenylenediamine, 4,4'-diamino-diphenylmethane, 4,4'- diaminodiphenylether, 3,4'-diaminodiphenylether, 4,4'-diaminodiphenylsulfone, 4,4'-diaminodiphenylsulfide, m-xylenediamine, p-xylenediamine, 1,3-bis(p-aminocumyl)-benzene, 1,4-bis(p-aminocumyl)-benzene, 1,3-bis(4-aminophenoxy)benzene, 1,4-bis(4-aminophenoxy)benzene, 2,2'-bis[4-(4-aminophenoxy) phenyl]propane, hexamethylenediamine, etc.

Among these compounds, 4,4'-diaminodiphenylmethane, 1,3-bis(4-aminophenoxy)benzene, 1,3-bis(p-aminocumyl)benzene and 1,4-bis(p-aminocumyl)benzene are particularly preferred.

It is recommended that N,N'-bisimide and diamine be reacted in such amounts that the molar ratio of N,N'-bisimide to diamine is in the range of from 1.2:1 to 50:1, preferably from 1.5:1 to 5:1.

In the present invention, it is important that the bisimide represented by formula (I) be reacted with a diamine in the presence of a radical scavenger. Useful radical scavengers include, but are not limited to, the following examples: stable radicals such as 1,1-diphenyl-2-picrylhydrazyl, 1,3,5-triphenylferdazyl, 2,6-di-t-butyl-α-(3,5-di-t-butyl)-4-oxo-2,5-cyclohexadien-1-ylidene-p-tolyloxy; divalent phenols and alkyl-substituted derivatives thereof such as hydroquinone, t-butylhydroquinone, 2,5-di-tbutylhydroquinone, catechol, and t-butylcatechol; phenol derivatives that are alkyl- or alkoxy-substituted on the phenol nucleus such as 2,5-di-t-butyl-4-methylphenol and 4methoxyphenol; benzoquinone and derivatives thereof that are alkyl- or halogen-substituted on the quinone nucleus such as 2-methylbenzoquinone and 2-chlorobenzoquinone; and nitrosobenzene, nitrobenzene, m-dinitrobenzene, sulfur and metal salts of higher valency such as ferric chloride.

Particularly preferred are t-butylcatechol, 4-methoxyphenol, hydroquinone, hydroquinone derivatives that are alkyl- or alkoxy-substituted on the hydroquinone nucleus, benzoquinone, nitrosobenzene, and 2,2-diphenyl-1,1-picrylhydrazyl. Most preferred are hydroquinone, t-butylhydroquinone, and 2,2-diphenyl-1,1-picrylhydrazyl.

These radical scavengers are used in amounts ranging generally from about 0.0005 to about 1 wt%, preferably from about 0.001 to about 0.1 wt%, of the sum of bisimide and diamine. If they are used in large amounts, a longer time would be required to cure the prepolymer obtained.

In order to produce the imide-based prepolymer of the present invention, the starting materials must be reacted under heating. Reaction under heating is usually performed at an appropriate temperature between 100° and 200° C. for a period that ranges from several minutes to several hours.

Smooth reaction may be realized by first heating the diamine component to melt, then adding the bisimide component and performing the reaction in a molten state.

The imide-based prepolymer of the present invention dissolves in inert polar solvents such as dimethylformamide, N-methylpyrrolidone, dimethylacetamide, diethylene glycol dimethyl ether, methyl cellosolve, etc. Thus, the reaction will proceed more smoothly in these solvents to produce an imide-based prepolymer having improved characteristics.

As already mentioned, the imide-based prepolymer obtained by the present invention dissolves in polar solvents such as dimethylformamide, N-methylpyrrolidone and dimethylacetamide, and solutions of this imide-based prepolymer dissolved in such solvents are particularly preferred for use as varnish in the fabrication of laminated boards.

The prepolymer thus obtained may be used either as solution in the solvents mentioned above or as a powder.

The so obtained imide-based prepolymer may be directly cured by heating at a temperature of ca. 180°–250° C. for 10 minutes to 2 hours, with pressure applied if desired.

In order for the cured imide-based prepolymer to exhibit its inherent physical properties, post-curing must be performed at a temperature of ca. 180°–250° C. for a period of ca. 4–48 hours.

The imide-based prepolymer obtained by the method described above has high heat stability as a thermosetting resin and may be used in a broad range of applications. In particular, taking advantage of its high solubility in solvents, the prepolymer may be used to prepare various types of varnish which have high storage stability.

In accordance with a second aspect of the present invention, the imide-based prepolymer obtained by the process described above is dissolved in a solvent to make varnish.

Solvents that can be used are not limited to any particular type but may include the following: dimethylformamide, dimethylsulfoxide, N-methylpyrrolidone, dioxane, tetrahydrofuran, chlorobenzene, methyl ethyl ketone, cyclohexane, methyl acetate, methyl cellosolve, diethylene glycol dimethyl ether, dimethyl carbonate, dioxane, etc. Preferred examples are dimethyl carbonate, dioxane, methyl cellosolve, and diethylene glycol dimethyl ether.

The ratio of imide-based prepolymer to solvent may be adjusted to a desired value depending upon the specific use of the prepolymer.

The curing of the imide-based prepolymer of the present invention is somewhat reacted since a radical scavenger is used in its production. Therefore, a cure accelerator may be added in a small amount to the prepolymer as required, or if the prepolymer is to be used as varnish, a cure accelerator may be added after it has been worked into varnish.

Cure accelerators that may be used include the following: imidazoles such as 2-methylimidazone, 2-ethyl-4-methylimidazone, 2-undecylimidazole, 2-phenylimidazole, 1-benzyl-2-methylimidazole, and 1-cyanoethyl-2-ethyl-4-methylimidazole; tertiary amines such as triethylamine and benzyldimethylamine; organic carboxylic acids such as benzoic acid, p-toluic acid, p-t-butylbenzoic acid, o-chlorobenzoic acid and isomers thereof, o-nitrobenzoic acid and isomers thereof, o-hydroxybenzoic acid and isomers thereof, o-methoxybenzoic acid and isomer thereof, o-nitrobenzoic acid and isomers thereof, o-aminobenzoic acid and isomers thereof, and o-phthalic acid and isomers thereof; aromatic carboxylic acids such as trimellitic acid, pyromellitic acid and benzophenonetetracarboxylic acid; aliphatic monocarboxylic acids such as formic acid, acetic acid, propionic acid, phenylacetic acid, cinnamic acid, glycolic acid, lactic acid, and tartaric acid; aliphatic dicarboxylic acids such as oxalic acid, malonic acid, succinic acid, glutaric acid, maleic acid and fumaric acid; acid anhydrides such as acetic anhydride, propionic anhydride, succinic anhydride, maleic anhydride, tetrahydroxyphthalic anhydride, tetrahydroxymethylphthalic anhydride, nadic anhydride, trimellitic anhydride, pyromellitic dianhydride, and 3,3',4,4'-benzophenonetetra-carboxylic dianhydride; radical generators such as peroxides (e.g. cumene hydroperoxide, t-butyl hydroperoxide, dicumyl peroxide and di-t-butyl peroxide), azo compounds (e.g. α,α'-azobisisobutyronitrile and azobiscyclohexanecarbonitrile), dimethylaniline, cobalt naphthenate and sulfinic acid.

Among these compounds, imidazoles are preferred, with 2-phenyl-4-methylimidazole being particularly preferred.

A lubricant or release agent may be added, as required, to the imide-based prepolymer of the present invention and examples of such additives are listed below: carnauba wax, bees wax, rice wax, stearic acid, aliphatic acid esters such as butyl ethers, aliphatic acid amides such as ethylene bisstearoamide, aliphatic acids (e.g. montanic acid and stearic acid) and metal salts thereof, petroleum wax, polyethylene wax, polypropylene wax and products of their oxidation, and silicone oils such as polymethylsiloxane and polymethylphenylsiloxane.

These lubricants or release agents are added in amounts that range preferably from 0.1 to 5 wt% of the sum of the unsaturated bisimide of formula (I) and diamine.

If necessary, the imide-based prepolymer of the present invention may be mixed with a rubber component such as an amine-terminated butadiene nitrile rubber (ATBN) or a resin component such as Teflon, silicone resin, phenolic resin or aniline resin. These rubber or resin components are preferably added in amounts ranging from 10 to 200 wt% of the sum of the unsaturated bisimide of formula (I) and diamine.

In addition, the following inorganic or organic substances may be optionally incorporated as filler components in the imide-based prepolymer of the present invention: a silica powder, an alumina powder, a glass powder, mica, talc, barium sulfate, titanium oxide, molybdenum disulfide, an aluminum powder, an iron powder, a copper powder, metal hydroxides such as aluminum hydroxide and magnesium hydroxide, microbaloons of silica, alumina, glass, phenolic resin, etc., and reinforcement fibers such as glass fibers, alumina fibers, carbon fibers, aramid fibers, silicon carbide fibers, aluminum fibers, and copper fibers.

These filler components are preferably added in amounts ranging from 50 to 500 wt% of the sum of the unsaturated bisimide of formula (I) and diamine.

The following examples are provided for the purpose of further illustrating the present invention but are in no way to be taken as limiting.

EXAMPLE 1

A 500 ml separable flask was charged with 36.2 g of 4,4'-diaminodiphenylmethane and 0.02 g of t-butylhydroquinone and submerged in an oil bath at 150° C. When the 4,4'-diaminodiphenylmethane dissolved completely, 163.8 g of N,N'-4,4'-diphenylmethanebismaleimide (molar ratio 2.5) was added with stirring over a period of 2 minutes, and reaction was performed for 13 more minutes with stirring.

The reaction mixture was poured into a vat, which was placed in an air oven at 170° C. and subjected to reaction under heating for 16 minutes. The resulting prepolymer was then cooled and pulverized into particles.

This prepolymer was subjected to a solubility test and the results are shown in Table 1. The prepolymer was also subjected to measurements of gel time and viscosity and to GPC analysis under the conditions set forth below. The results are shown in Table 2.

(1) Gel time measurement

In accordance with JIS C 2104, gel time measurements were conducted with a gel tester of Nisshin Kagaku Co., Ltd. at 175° C.

(2) Viscosity measurement

A 40 wt% solution was prepared using N-methylpyrrolidone as a solvent and its viscosity was measured at 25° C.

(3) GPC analysis

Analysis conditions were as follows:
Columns: AD-800p+AD-80M+AD-803/S×2
Solvent:dimethylformamide containing 0.01 mol LiBr
Director: 280 nm (uv)
Standard: polyethylene glycol

EXAMPLE 2

A 500 ml separable flask was charged with 55.5 g of 4,4'-(m-phenylenediisopropylidene)bisaniline and 0.02 g of t-butylhydroquinone, and submerged in an oil bath at 150° C.

When the 4,4'-(m-phenylenediisopropylidene)bisaniline dissolved completely, 144.5 g of N,N'-4,4'-diphenylmethanebismaleimide (molar ratio 2.5) was added with stirring over a period of 2 minutes, and reaction was performed for 14 more minutes.

The reaction mixture was poured into a vat which was placed in an air oven at 170° C. and reaction was performed for 20 minutes. Thereafter, the resulting prepolymer was cooled and pulverized into particles.

This prepolymer was subjected to a solubility test. It was also subjected to measurements of gel time and viscosity, as well as to GPC analysis under the same conditions as those employed in Example 1.

The resin obtained in Example 2 was soluble in diethylene glycol dimethyl ether, so varnish of 50 wt% concentration was prepared and the time-dependent change in its viscosity was investigated, with the viscosity measurement being conducted as in Example 1. The results are shown in Table 3.

EXAMPLE 3

A 500 ml separable flask was charged with 49.2 g of 1,3-bis(4-aminophenoxy)benzene and 0.02 g of t-butylhydroquinone, and submerged in an oil bath at 150° C.

When the 1,3-bis(4-aminophenoxy)benzene dissolved completely, 150.8 g of N,N'-4,4'-diphenylmethanebismaleimide (molar ratio 2.5) was added with stirring over a period of 2 minutes, and reaction was performed for 18 more minutes.

The reaction mixture was poured into a vat, which was placed in an air oven at 170° C., and reaction was performed for 18 minutes. Thereafter, the resulting prepolymer was cooled and pulverized to particles.

This prepolymer was subjected to a solubility test. It was also subjected to measurements of gel time and viscosity, as well as to GPC analysis under the same conditions as those employed in Example 1.

COMPARATIVE EXAMPLE 1

A 500 ml separable flask was charged with 36.2 g of 4,4'-diaminophenylmethane and submerged in an oil bath at 150° C.

When the 4,4'-diaminodiphenylmethane melted, 163.8 g of N,N'-4,4'-diphenylmethanebismaleimide was added in 2 minutes. Subsequently, reaction was performed for 10 minutes and the reaction mixture was poured into a vat. The vat was transferred into an air oven set at 170° C. and reaction was performed under heating for 18 minutes. Thereafter, the resulting prepolymer was cooled and pulverized into particles. A solubility test on this prepolymer and measurements of the physical properties of the resin were conducted as in Example 1.

The prepolymer obtained in Comparative Example 1 was insoluble in diethylene glycol dimethyl ether, so varnish of 50 % concentration was prepared using N-methylpyrrolidone and the time-dependent change in its viscosity was investigated as in Example 2. The results are shown in Table 3.

TABLE 1

Solubility Test on Imide-Based Prepolymer*

| Solvent | Example 1 | Example 2 | Example 3 | Comparative Example 1 |
|---|---|---|---|---|
| Dioxane | O | O | O | X |
| Tetrahydrofuran | O | O | O | X |
| Chloroform | O | O | O | X |
| Methyl cellosolve | O | O | O | X |
| Diethylene glycol dimethyl ether | O | O | O | X |
| Methyl acetate | X | O | O | X |
| N-methylpyrrolidone | O | O | O | O |
| Dimethylformamide | O | O | O | O |

*Solubility: The resin was mixed with a solvent to a concentration of 40% and its solubility was evaluated by the following criteria; O, clear and homogeneous solution formed; X, either turbidity or incomplete dissolution occurred.

TABLE 2

Physical Properties of Imide-Based Polymer

| Parameter | Example 1 | Example 2 | Example 3 | Comparative Example 1 |
|---|---|---|---|---|
| Viscosity (cPs)* | 45 | 95 | 45 | 90 |
| Gel time | 18' 30" | 8' 20" | 16' 20" | 3' 10" |
| GPC | | | | |
| Mn | 730 | 890 | 750 | 730 |
| Mw | 960 | 1320 | 1050 | 1140 |
| Mn/Mw | 1.32 | 1.48 | 1.40 | 1.58 |

*Resin concentration: 40%

TABLE 3

Time-Dependent Change in Varnish

| | Solvent | Days stored* | | | | |
|---|---|---|---|---|---|---|
| | | 0 | 4 | 7 | 14 | 21 |
| Example 2 | Diethylene glycol dimethyl ether | 100** | 120 | 140 | 160 | 210 |
| Comparative Example 1 | N-methylpyrrolidone | 400 | 580 | 790 | — | — |

*Storage temperature: 21° C. Resin concentration: 50%
**Viscosity in cPs

The imied-based prepolymer produced by the process of the present invention has high solubility in a broad range of solvents including low-boiling point solvents. This polymer can be worked into varnish that has high storage stability.

What is claimed is:

1. A process for producing an imide-based prepolymer which comprises reacting an unsaturated bisimide selected from the group consisting of N,N'-ethylenebismaleimide, N,N'-hexamethylenebismaleimide, N,N'-m-phenylenebismaleimide, N,N'-p-phenylenebismaleimide, N,N'-4,4'-diphenylmethanebismaleimide, N,N'-4,4'-diphenyletherbismaleimide, N,N'-3,4'-diphenylsulfonebismaleimide, N,N'-4,4'-diphenylsulfonebismaleimide, N,N'-m-xylenebismaleimide, N,N'-cyclohexanebismaleimide and N,N'-4,4'-diphenylmethanebiscitraconimide with a diamine in the presence of a radical scavenger selected from alkyl-substituted derivatives of divalent phenols.

2. The process according to claim 1 wherein the diamine is a member selected from aliphatic, alicyclic or aromatic diamines having 2 to 3 carbon atoms.

3. The process according to claim 1 wherein the radical scavenger is at least a member selected from the group consisting of t-butyl-hydroquinone, 2,5-di-t-butylhydroquinone and t-butyl catechol.

4. The process according to claim 1 wherein the radical scavenger is t-butylhydroquinone.

5. The process according to claim 1 wherein the amount of said radical scavenger used is from about 0.005 to 1% by weight of the total weight of the bisimide and the diamine.

6. The process according to claim 1 wherein the molar ratio of the bisimide to diamine is in the range of from 1:2:1 to 50:1.

7. The process according to claim 1 wherein the molar ratio of the bisimide to diamine is in the range of from 1.5:1 to 5:1.

8. The process according to claim 1 wherein the amount of said radical scavenger used is from about 0.001 to 0.1% by weight of the total weight of the bisimide and the diamine.

9. The process according to claim 1 wherein the reacting is conducted under heating at a temperature of about 100° to 200° C. for a period of from several minutes to several hours.

10. A varnish comprising an imide-based prepolymer dissolved in a solvent, said imide-based prepolymer having been produced by a process which comprises reacting an unsaturated bisimide selected from the group consisting of N,N'-ethylenebismaleimide, N,N'-hexamethylenebismaleimide, N,N'-m-phenylenebismaleimide, N,N'-p-phenylenebismaleimide, N,N'-4,4'-diphenylmethanebismaleimide, N,N'-4,4'-diphenyletherbismaleimide, N,N'-3,4'-diphenyletherbismaleimide, N,N'-diphenylsulfoneismaleimide, N,N'-m-xylenebismaleimide, N,N'-cyclohexanebismaleimide and N,N'-4,4'-diphenylmethanebiscitraconimide with a diamine in the presence of a radical scavenger selected from alkyl-substituted derivatives of divalent phenols.

11. The varnish according to claim 10 wherein the diamine is a member selected from aliphatic, alicyclic or aromatic diamines having 2 to 30 carbon atoms.

12. The varnish according to claim 10 wherein the radical scavenger is at least a member selected from the group consisting of t-butyl-hydroquinone, 2,5-di-t-butylhydroquinone, and t-butyl cathechol.

13. The varnish according to claim 10 wherein the radical scavenger is t-butylhydroquinone.

14. The varnish according to claim 10 wherein the solvent is selected from the group consisting of dimethylformamide, dimethyl sulfoxide, N-methylpyrrolidone, tetrahydrofuran, chlorobenzene, methyl ethyl ketone, cyclohexane, methyl acetate, methyl cellosolve, diethylene glycol dimethyl ether, dimethyl carbonate and dioxane.

15. The varnish according to claim 10 wherein the amount of said radical scavenger used is from about 0.005 to 1% by weight of the total weight of the bisimide and the diamine.

16. The varnish according to claim 10 wherein the molar ratio of the bisimide to diamine is in the range of from 1.2:1 to 50:1.

17. The varnish according to claim 10 wherein the molar ratio of the bisimide to diamine is in the range of from 1.5:1 to 5:1.

18. The varnish according to claim 10 wherein the amount of said radical scavenger used is from about 0.001 to 0.1% by weight of the total weight of the bisimide and the diamine.

19. The varnish according to claim 10 wherein the reacting is conducted under heating at a temperature of about 100° to 200° C. for a period of from several minutes to several hours.

* * * * *